(12) United States Patent
Lee

(10) Patent No.: US 9,246,479 B2
(45) Date of Patent: Jan. 26, 2016

(54) LOW-OFFSET BANDGAP CIRCUIT AND OFFSET-CANCELLING CIRCUIT THEREIN

(71) Applicant: VIA TECHNOLOGIES, INC., New Taipei (TW)

(72) Inventor: Yeong-Sheng Lee, Fremont, CA (US)

(73) Assignee: VIA TECHNOLOGIES, INC., New Taipei (TW)

( * ) Notice: Subject to any disclaimer, the term of this patent is extended or adjusted under 35 U.S.C. 154(b) by 82 days.

(21) Appl. No.: 14/159,191

(22) Filed: Jan. 20, 2014

(65) Prior Publication Data

US 2015/0207497 A1    Jul. 23, 2015

(51) Int. Cl.
| H03L 5/00 | (2006.01) |
| H03K 5/003 | (2006.01) |
| H03F 3/45 | (2006.01) |

(52) U.S. Cl.
CPC ............ *H03K 5/003* (2013.01); *H03F 3/45475* (2013.01); *H03F 3/45982* (2013.01); *H03F 2203/45212* (2013.01)

(58) Field of Classification Search
None
See application file for complete search history.

(56) References Cited

U.S. PATENT DOCUMENTS

| 6,433,615 | B2 * | 8/2002 | Nagano et al. ................. 327/513 |
| 6,885,179 | B1 | 4/2005 | Ker et al. |
| 7,636,010 | B2 | 12/2009 | Huang |
| 2001/0040241 | A1 * | 11/2001 | Nagano et al. ................. 257/159 |
| 2005/0001605 | A1 * | 1/2005 | Marinca ........................ 323/314 |
| 2009/0051342 | A1 | 2/2009 | Peng et al. |
| 2012/0194265 | A1 * | 8/2012 | Katsube et al. ............... 327/554 |
| 2012/0212194 | A1 * | 8/2012 | Tachibana et al. ............ 323/268 |
| 2013/0106389 | A1 * | 5/2013 | Routray ........................ 323/313 |
| 2014/0266832 | A1 * | 9/2014 | Schrom et al. ................. 341/144 |

FOREIGN PATENT DOCUMENTS

| CN | 102393785 | 3/2012 |
| CN | 103197716 | 7/2013 |
| TW | 200910048 | 3/2009 |
| TW | 200912587 | 3/2009 |

* cited by examiner

*Primary Examiner* — Lincoln Donovan
*Assistant Examiner* — Khareem E Almo
(74) *Attorney, Agent, or Firm* — McClure, Qualey & Rodack, LLP

(57) ABSTRACT

A low-offset bandgap circuit including a core bandgap circuit and an offset-cancelling circuit is provided. The low-offset bandgap circuit provides a reference voltage at an output node. The core bandgap circuit includes a core operational amplifier to generate a core current. The offset-cancelling circuit is coupled to two input terminals of the core operational amplifier. The offset-cancelling circuit is configured to generate a compensation current according to the voltages at the two input terminals of the core operational amplifier so as to compensate for an offset voltage of the core operational amplifier. The reference voltage is generated according to the core current and the compensation current.

16 Claims, 5 Drawing Sheets

LOW-OFFSET BANDGAP CIRCUIT AND OFFSET-CANCELLING CIRCUIT THEREIN

BACKGROUND OF THE INVENTION

1. Field of the Invention

The disclosure generally relates to a bandgap circuit, and more particularly, relates to a low-offset bandgap circuit and an offset-cancelling circuit therein.

2. Description of the Related Art

A bandgap circuit is widely used as a power supply circuit capable of generating a constant reference voltage or a reference current without being affected by the power supply voltage fluctuation or the temperature fluctuation in a semiconductor device.

However, in fact, the output voltage of a bandgap circuit is often negatively affected by the offset of the operational amplifier therein, and it is more unstable than the ideal case. Accordingly, there is a need to design a new bandgap circuit to reduce its output fluctuation caused by the offset of the operational amplifier.

BRIEF SUMMARY OF THE INVENTION

In a preferred embodiment, the invention is directed to a low-offset bandgap circuit to provide a reference voltage at an output node, comprising: a core bandgap circuit, comprising a core operational amplifier to generate a core current; and an offset-cancelling circuit, coupled to two input terminals of the core operational amplifier, and generating a compensation current according to voltages at the two input terminals of the core operational amplifier to compensate for an offset voltage of the core operational amplifier, wherein the reference voltage is generated according to the core current and the compensation current.

In some embodiments, the offset-cancelling circuit comprises two operational amplifiers, and an offset voltage of each of the operational amplifiers is substantially equal to the offset voltage of the core operational amplifier. In some embodiments, each of the operational amplifiers has at least one input terminal coupled to a respective one of the input terminals of the core operational amplifier. In some embodiments, the core operational amplifier has a first input terminal coupled to a first node, a second input terminal coupled to a second node, and an output terminal, wherein the compensation current is generated according to a first current and a second current, and wherein the first current is generated according to a voltage at the first node and the second current is generated according to a voltage at the second node. In some embodiments, the offset-cancelling circuit comprises: a first operational amplifier, having a first input terminal coupled to the first node, a second input terminal, and an output terminal; a first P-type transistor, having a gate coupled to the output terminal of the first operational amplifier, a source coupled to a work voltage, and a drain generating the first current; a second P-type transistor, having a gate coupled to the output terminal of the first operational amplifier, a source coupled to the work voltage, and a drain coupled to the second input terminal of the first operational amplifier; and a first resistor, coupled between the second input terminal of the first operational amplifier and the ground voltage. In some embodiments, the offset-cancelling circuit comprises: a second operational amplifier, having a first input terminal coupled to the second node, a second input terminal, and an output terminal; a third P-type transistor, having a gate coupled to the output terminal of the second operational amplifier, a source coupled to a work voltage, and a drain generating the second current; a fourth P-type transistor, having a gate coupled to the output terminal of the second operational amplifier, a source coupled to the work voltage, and a drain coupled to the second input terminal of the second operational amplifier; and a second resistor, coupled between the second input terminal of the second operational amplifier and the ground voltage. In some embodiments, the compensation current is generated by subtracting the second current from the first current. In some embodiments, the core bandgap circuit further comprises: a first BJT (Bipolar Junction Transistor), wherein the first BJT has a base coupled to the ground voltage, an emitter coupled to the first node, and a collector coupled to the ground voltage; a second BJT, wherein the second BJT has a base coupled to the ground voltage, an emitter, and a collector coupled to the ground voltage; a third BJT, wherein the third BJT has a base coupled to the ground voltage, an emitter, and a collector coupled to the ground voltage; a third resistor, coupled between the second node and the emitter of the second BJT; and a fourth resistor, coupled between the output node and the emitter of the third BJT, wherein the core current is generated according to a resistance of the third resistor and emitter areas of the first BJT and the second BJT. In some embodiments, the reference voltage is generated according to resistances of the third resistor and the fourth resistor and emitter areas of the first BJT, the second BJT, and the third BJT. In some embodiments, the emitter area ratio of the first BJT to the second BJT to the third BJT is substantially 1:8:1. In some embodiments, the resistance of the third resistor is substantially equal to 100 kΩ, and a resistance of the fourth resistor is substantially equal to 1000 kΩ.

In another preferred embodiment, the invention is directed to a corrector for correcting an output voltage of a bandgap circuit comprising a core operational amplifier with an offset voltage, the bandgap circuit providing a reference voltage at an output node, the core operational amplifier generating a core current, and the corrector comprising: an offset-cancelling circuit, generating a compensation current according to voltages at two input terminals of the core operational amplifier to compensate for the offset voltage of the core operational amplifier, wherein the reference voltage is generated according to the core current and the compensation current.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are described in detail as follows.

Figure 1:
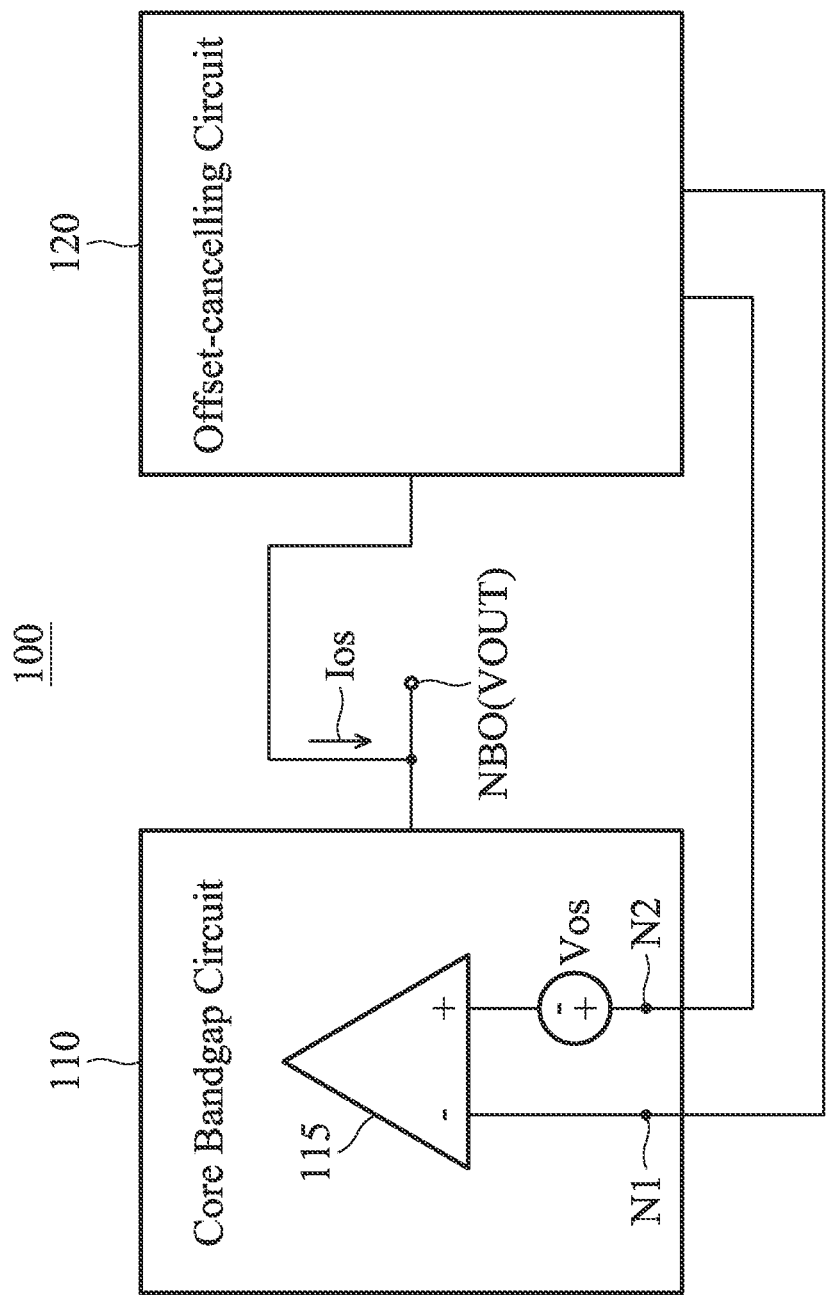
FIG. 1 is a diagram for illustrating a low-offset bandgap circuit according to an embodiment of the invention.

FIG. 1 is a diagram for illustrating a low-offset bandgap circuit 100 according to an embodiment of the invention. As shown in FIG. 1, the low-offset bandgap circuit 100 includes a core bandgap circuit 110 and an offset-cancelling circuit 120. The core bandgap circuit 110 is coupled to a work voltage (not shown) and outputs an output voltage VOUT (e.g., 1.2V) at a bandgap output node NBO. The core bandgap circuit 110 at least includes a core operational amplifier 115. To simplify the diagram, other components of the core bandgap circuit 110 are omitted and not shown in FIG. 1. The core operational amplifier 115 has a first input terminal coupled to a first node N1, a second input terminal coupled to a second node N2, and an output terminal Due to some process variations and temperature variations, the core operational amplifier 115 may have an offset voltage Vos. The offset voltage Vos is unexpected, and it often negatively affects the output voltage VOUT and degrades the performance of the core bandgap circuit 110. In the embodiment of FIG. 1, the offset voltage Vos is modeled as a voltage source coupled to the second input terminal of the core operational amplifier 115. It is understood that the adjustments may be made such that the aforementioned voltage source is coupled to the first input terminal of the core operational amplifier 115 but is arranged in a reverse direction. The offset-cancelling circuit 120 is coupled to the first input terminal and the second input terminal (i.e., the first node N1 and the second node N2) of the core operational amplifier 115. The offset-cancelling circuit 120 is configured to generate a compensation current Ios according to the two voltages at the first input terminal and the second input terminal of the core operational amplifier 115. The compensation current Ios may flow through the bandgap output node NBO of the core bandgap circuit 110 so as to compensate for the offset voltage Vos of the core operational amplifier 115. After the compensation, the core bandgap circuit 110 can provide a clear and stable output voltage VOUT, regardless of the offset voltage Vos. The detailed circuits and operations of the low-offset bandgap circuit 100 may be further illustrated in the following figures and embodiments.

Figure 2:
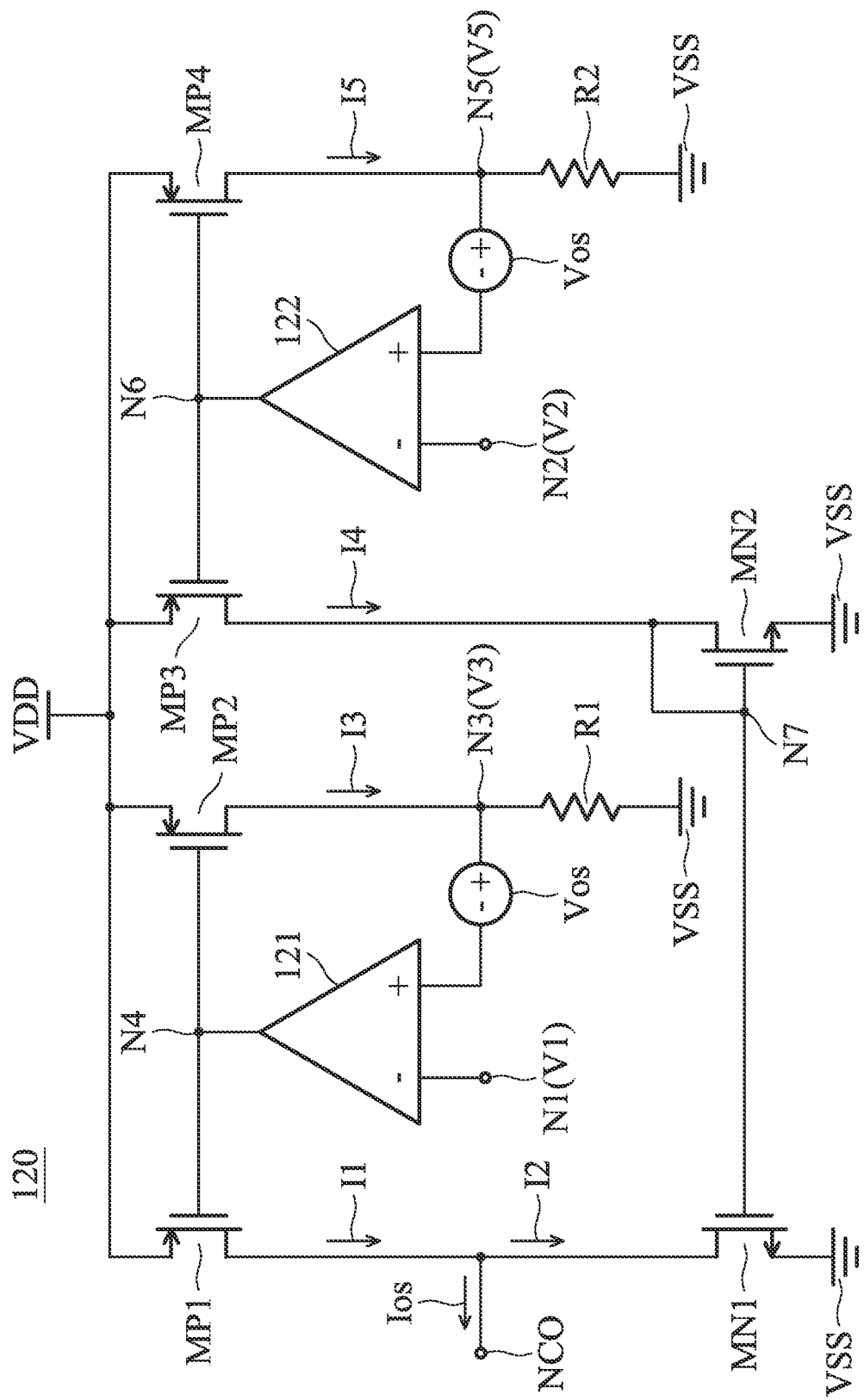
FIG. 2 is a schematic diagram for illustrating an offset-cancelling circuit according to an embodiment of the invention.

FIG. 2 is a schematic diagram for illustrating the offset-cancelling circuit 120 according to an embodiment of the invention. In the embodiment of FIG. 2, the offset-cancelling circuit 120 includes a first operational amplifier 121, a second operational amplifier 122, a first PMOS transistor (P-type Metal Oxide Semiconductor Field Effect Transistor) MP1, a second PMOS transistor MP2, a third PMOS transistor MP3, a fourth PMOS transistor MP4, a first NMOS transistor (N-type Metal Oxide Semiconductor Field Effect Transistor) MN1, a second NMOS transistor MN2, a first resistor R1, and a second resistor R2. The first operational amplifier 121 has a first input terminal coupled to the first node N1 (i.e., the first input terminal of the core operational amplifier 115), a second input terminal coupled to a third node N3, and an output terminal coupled to a fourth node N4. The second operational amplifier 122 has a first input terminal coupled to the second node N2 (i.e., the second input terminal of the core operational amplifier 115), a second input terminal coupled to a fifth node N5, and an output terminal coupled to a sixth node N6. In some embodiments, the first operational amplifier 121 and the second operational amplifier 122 are appropriately designed to be identical to and in the vicinity of the core operational amplifier 115, and therefore the offset voltage of each of the first operational amplifier 121 and the second operational amplifier 122 is substantially equal to the offset voltage Vos of the core operational amplifier 115. Similarly, the offset voltages Vos are also modeled as voltage sources shown in FIG. 2, and each of the first operational amplifier 121 and the second operational amplifier 122 has a respective offset voltage source (Vos) coupled to its second input terminal.

The first PMOS transistor MP1 has a gate coupled to the fourth node N4, a source coupled to a work voltage VDD (e.g., 1.5V or 3V), and a drain coupled to a compensation output node NCO of the offset-cancelling circuit 120. The compensation output node NCO is arranged to output the compensation current Ios to the core bandgap circuit 110. The second PMOS transistor MP2 has a gate coupled to the fourth node N4, a source coupled to the work voltage VDD, and a drain coupled to the third node N3. The first NMOS transistor MN1 has a gate coupled to a seventh node N7, a source coupled to a ground voltage VSS (e.g., 0V), and a drain coupled to the compensation output node NCO. The first resistor R1 is coupled between the third node N3 and the ground voltage VSS. The third PMOS transistor MP3 has a gate coupled to the sixth node N6, a source coupled to the work voltage VDD, and a drain coupled to the seventh node N7. The fourth PMOS transistor MP4 has a gate coupled to the sixth node N6, a source coupled to the work voltage VDD, and a drain coupled to the fifth node N5. The second NMOS transistor MN2 has a gate coupled to the seventh node N7, a source coupled to the ground voltage VSS, and a drain coupled to the seventh node N7. The second resistor R2 is coupled between the fifth node N5 and the ground voltage VSS. In some embodiments, the first PMOS transistor MP1, the second PMOS transistor MP2, the third PMOS transistor MP3, and the fourth PMOS transistor MP4 substantially have the same transistor sizes (i.e., aspect ratios). In some embodiments, the first NMOS transistor MN1 and the second NMOS transistor MN2 substantially have the same transistor sizes (i.e., aspect ratios). In some embodiments, the resistance of each of the first resistor R1 and the second resistor R2 is substantially equal to 100 kΩ.

Figure 3:
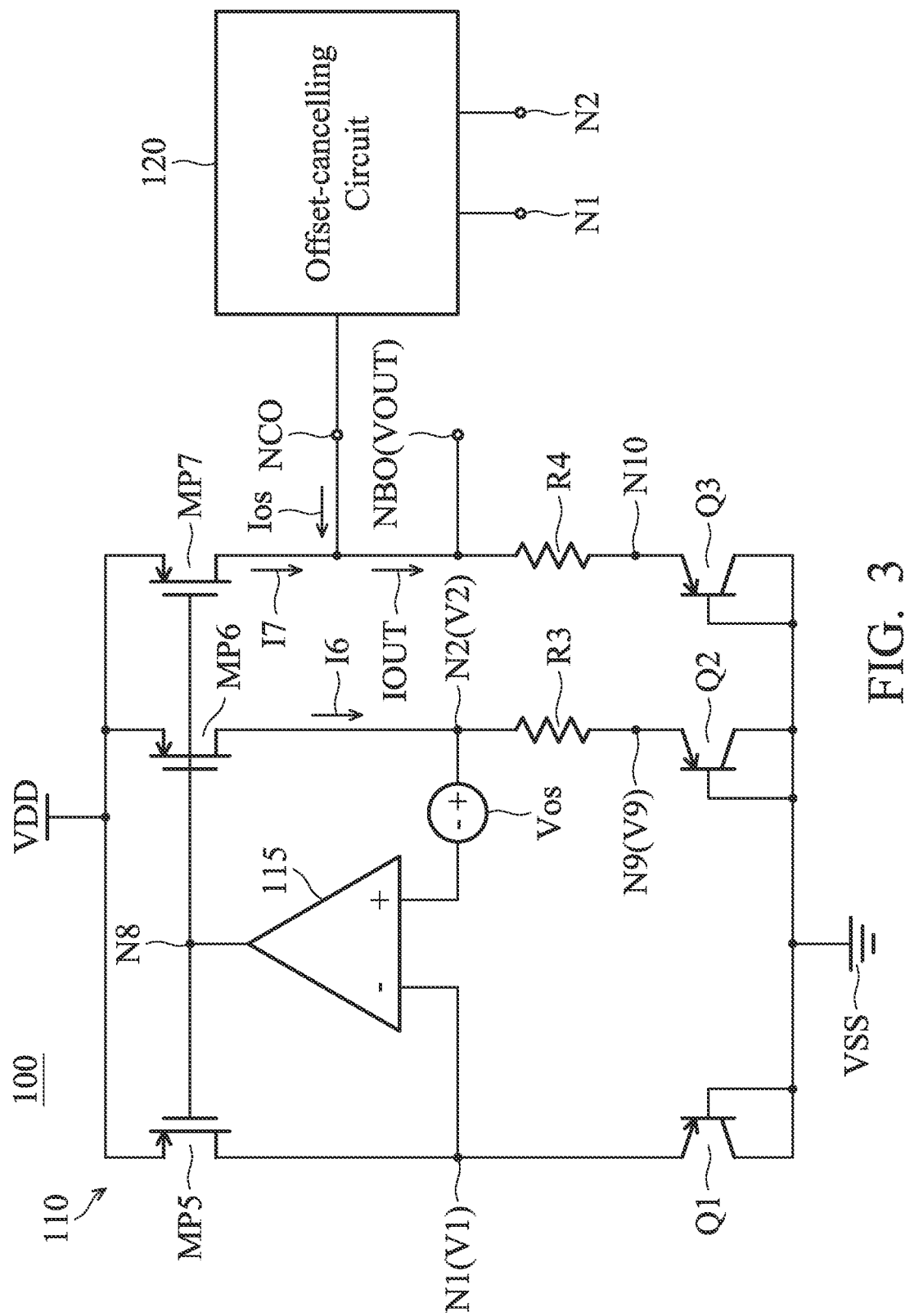
FIG. 3 is a schematic diagram for illustrating a core bandgap circuit according to an embodiment of the invention.

FIG. 3 is a schematic diagram for illustrating the core bandgap circuit 110 according to an embodiment of the invention. In the embodiment of FIG. 3, the core bandgap circuit 110 includes the core operational amplifier 115 with the offset voltage Vos, a fifth PMOS transistor MP5, a sixth PMOS transistor MP6, a seventh PMOS transistor MP7, a first BJT (Bipolar Junction Transistor) Q1, a second BJT Q2, a third BJT Q3, a third resistor R3, and a fourth resistor R4. The output terminal of the core operational amplifier 115 is coupled to an eighth node N8. The fifth PMOS transistor MP5 has a gate coupled to the eighth node N8, a source coupled to the work voltage VDD, and a drain coupled to the first node N1 (i.e., the first input terminal of the core operational amplifier 115). The sixth PMOS transistor MP6 has a gate coupled to the eighth node N8, a source coupled to the work voltage VDD, and a drain coupled to the second node N2 (i.e., the second input terminal of the core operational amplifier 115). The seventh PMOS transistor MP7 has a gate coupled to the eighth node N8, a source coupled to the work voltage VDD, and a drain coupled to the bandgap output node NBO of the core bandgap circuit 110. The bandgap output node NBO is further coupled to the compensation output node NCO of the offset-cancelling circuit 120 so as to receive the compensation current Ios from the offset-cancelling circuit 120. The third resistor R3 is coupled between the second node N2 and a ninth node N9. The fourth resistor R4 is coupled between the bandgap output node NBO and a tenth node N10. The first BJT Q1 has a base coupled to the ground voltage VSS, an emitter coupled to the first node N1, and a collector coupled to the ground voltage VSS. The second BJT Q2 has a base coupled to the ground voltage VSS, an emitter coupled to the ninth node N9, and a collector coupled to the ground voltage VSS. The third BJT Q3 has a base coupled to the ground voltage VSS, an emitter coupled to the tenth node N10, and a collector coupled to the ground voltage VSS. In some embodiments, the first BJT Q1, the second BJT Q2, and the third BJT Q3 are all PNP-type. In some embodiments, the fifth PMOS transistor MP5, the sixth PMOS transistor MP6, and the seventh PMOS transistor MP7 substantially have the same transistor sizes (i.e., aspect ratios). In some embodiments, the emitter area ratio of the first BJT Q1 to the second BJT Q2 to the third BJT Q3 is substantially 1:8:1. In some embodiments, the resistance of the third resistor R3 is substantially equal to 100 kΩ, and the resistance of the fourth resistor R4 is substantially equal to 1000 kΩ.

Please refer to FIG. 2 and FIG. 3 together. The detailed operation of the low-offset bandgap circuit 100 may be analyzed as follows. In the offset-cancelling circuit 120, the current I1 is flowing from the work voltage VDD through the first PMOS transistor MP1 to the compensation output node NCO, and the current I2 is flowing from the compensation output node NCO through the first NMOS transistor MN1 to the ground voltage VSS. The compensation current Ios output from the offset-cancelling circuit 120 to the core bandgap circuit 110 is therefore calculated according to equation (1):

$$Ios = I1 - I2 \qquad (1)$$

Since the first PMOS transistor MP1 and the second PMOS transistor MP2 form a first current mirror, the current I3 flowing through the second PMOS transistor MP2 is substantially the same as the current I1 flowing through the first PMOS transistor MP1. Furthermore, due to the virtual short and the offset voltage of the first operational amplifier 121, the voltage V3 at the third node N3 is slightly higher than the voltage V1 at the first node N1 by the offset voltage Vos. In such a manner, the current I1 is calculated according to equations (2) and (3):

$$V3 = V1 + Vos = VEB1 + Vos \qquad (2)$$

$$I1 = I3 = \frac{V3}{R3} = \frac{VEB1 + Vos}{R3} \qquad (3)$$

where VEB1 represents the voltage difference between the emitter and the base of the first BJT Q1 and is a function of the emitter area of the first BJT Q1.

Since the third PMOS transistor MP3 and the fourth PMOS transistor MP4 form a second current mirror, the current I5 flowing through the fourth PMOS transistor MP4 is substantially the same as the current I4 flowing through the third PMOS transistor MP3. Similarly, since the first NMOS transistor MN1 and the second NMOS transistor MN2 form a third current mirror, the current I4 flowing through the second NMOS transistor MN2 is substantially the same as the current I2 flowing through the first NMOS transistor MN1. Furthermore, due to the virtual short and the offset voltage of the second operational amplifier 122, the voltage V5 at the third node N5 is slightly higher than the voltage V2 at the second node N2 by the offset voltage Vos. In such a manner, the current I2 is calculated according to equations (4) and (5):

$$V5 = V2 + Vos \qquad (4)$$

$$I2 = I4 = I5 = \frac{V5}{R2} = \frac{V2 + Vos}{R2} \qquad (5)$$

In some embodiments, the first resistor R1, the second resistor R2, and the third resistor R3 are selected to have the same resistances (e.g., 100 kΩ). Due to the virtual short and the offset voltage of the core operational amplifier 115, the voltage V2 at the second node N2 is slightly higher than the voltage V1 at the first node N1 by the offset voltage Vos. As a result, the compensation current Ios is calculated according to equations (6), (7), and (8):

$$R1 = R2 = R3 \qquad (6)$$

$$V2 = V1 + Vos = VEB1 + Vos \qquad (7)$$

$$Ios = I1 - I2 = \frac{VEB1 + Vos}{R3} - \frac{V2 + Vos}{R2} = -\frac{Vos}{R3} \qquad (8)$$

On the other hand, in the core bandgap circuit 110, the voltage V9 at the ninth node N9 is lower than the voltage V1 at the first node N1 because the second BJT Q2 has a larger transistor size than the first BJT Q1 does. Since the sixth PMOS transistor MP6 and the seventh PMOS transistor MP7 form a fourth current mirror, the current I6 flowing through the sixth PMOS transistor MP6 is substantially the same as the current I7 (i.e., the core current) flowing through the seventh PMOS transistor MP7. Furthermore, the output current IOUT flowing through the bandgap output node NBO is the sum of the current I7 and the compensation current Ios from the offset-cancelling circuit 120. In such a manner, the output current IOUT is calculated according to equations (9), (10), and (11):

$$V9 = VEB2 \qquad (9)$$

$$I7 = I6 = \frac{V2 = V9}{R3} = \frac{VEB1 + Vos - VEB2}{R3} \qquad (10)$$

$$IOUT = I7 + Ios = \frac{VEB1 + Vos - VEB2}{R3} - \frac{Vos}{R3} = \frac{VEB1 - VEB2}{R3} \qquad (11)$$

where VEB2 represents the voltage difference between the emitter and the base of the second BJT Q2 and is a function of the emitter area of the second BJT Q2.

Finally, the output voltage VOUT at the bandgap output node NBO of the core bandgap circuit 110 is calculated according to equation (12):

$$VOUT = VEB3 + IOUT \times R4 = VEB3 + \frac{R4}{R3} \times (VEB1 - VEB2) \qquad (12)$$

where VEB3 represents the voltage difference between the emitter and the base of the third BJT Q3 and is a function of the emitter area of the third BJT Q3.

Therefore, after the offset-cancelling circuit 120 is included, the output voltage VOUT of the core bandgap circuit 110 is appropriately adjusted. According to the equation (12), the final output voltage VOUT is not related to the offset voltage Vos of the core operational amplifier 115 anymore.

Figure 4:
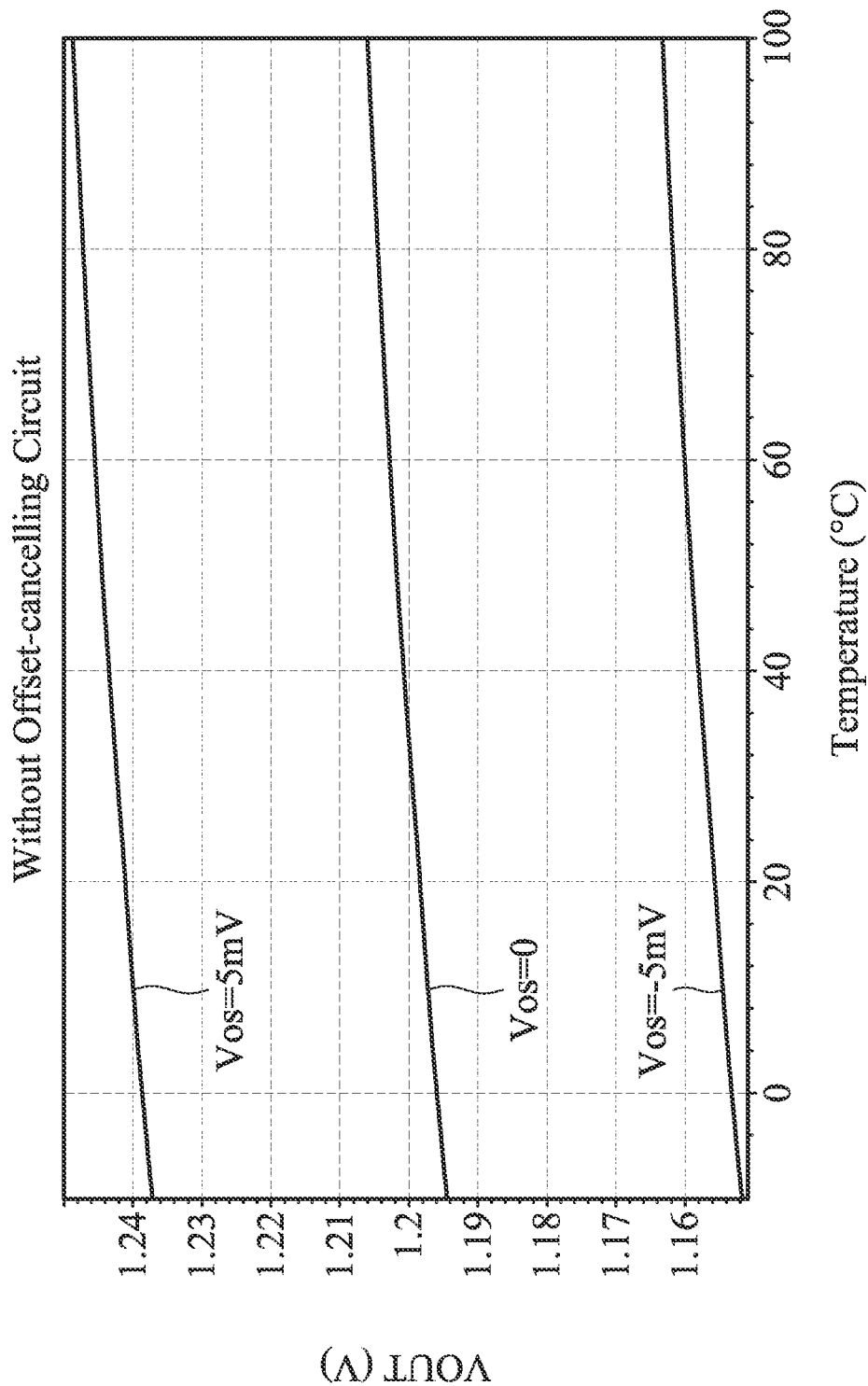
FIG. 4 is a diagram for illustrating an output voltage of a core bandgap circuit without any offset-cancelling circuit.

FIG. 4 is a diagram for illustrating the output voltage VOUT of the core bandgap circuit 110 without any offset-cancelling circuit 120. The horizontal axis represents the temperature (° C.), and the vertical axis represents the output voltage VOUT (V). According to the simulation result of FIG. 4, if the offset-cancelling circuit 120 is removed, the output voltage VOUT may be very sensitive to the offset voltage Vos of the core operational amplifier 115. For example, at a temperature of about 40° C., when the offset voltage Vos varies from −5 mV to 5 mV, the output voltage VOUT may therefore vary from 1.16V to 1.24V (where the correct output voltage should be 1.2V). That is, without the offset-cancelling circuit 120, the output voltage VOUT is not stable enough and cannot be applied to some critical circuits.

Figure 5:
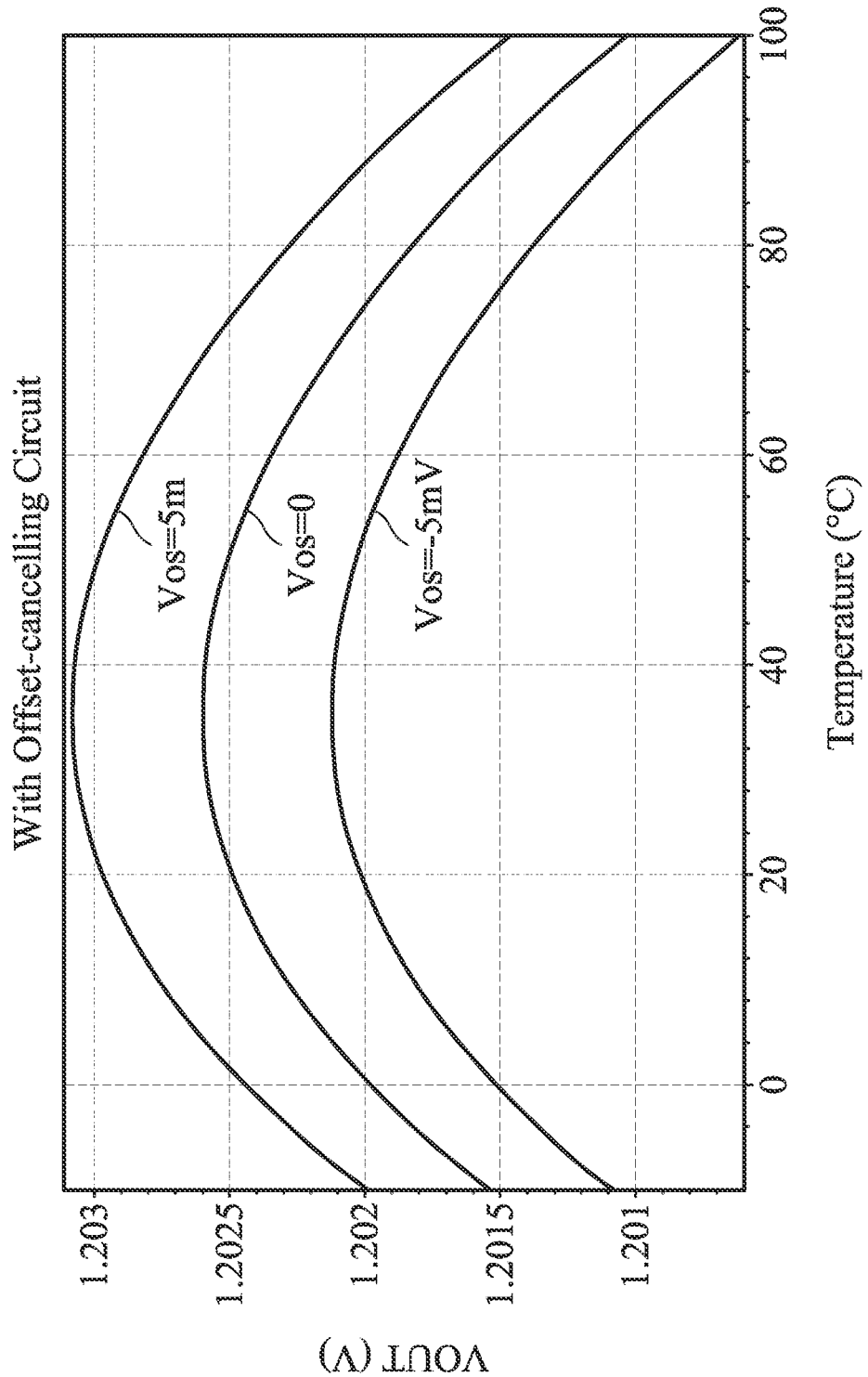
FIG. 5 is a diagram for illustrating an output voltage of a core bandgap circuit with an offset-cancelling circuit according to an embodiment of the invention.

FIG. 5 is a diagram for illustrating the output voltage VOUT of the core bandgap circuit 110 with the offset-cancelling circuit 120 according to an embodiment of the invention. According to the simulation result of FIG. 5, if the offset-cancelling circuit 120 is included, the output voltage VOUT may be relatively independent of the offset voltage Vos of the core operational amplifier 115. For example, at the temperature of about 40° C., when the offset voltage Vos varies from −5 mV to 5 mV, the output voltage VOUT may just vary from 1.202V to 1.203V (where the correct output voltage should be 1.2V). By comparing FIG. 4 with FIG. 5, it is understood that the offset-cancelling circuit 120 of the invention can effectively improve the stability of the output voltage VOUT of the core bandgap circuit 110.

Note that the above voltages, currents, resistances, transistor size ratios, and other element parameters are not limitations of the invention. A designer can adjust these parameters according to different requirements. Although MOSFETs are used as examples for transistors in the embodiments, those skilled in the art may use other types of field-effect transistors such as JFETs (junction field-effect transistors) or MESFETs (metal-semiconductor field-effect transistors). The invention may merely include any one or more features of any one or more embodiments of FIGS. 1-5. In other words, not all of the features shown in the figures should be implemented in the low-offset bandgap circuit and the offset-cancelling circuit of the invention. Furthermore, a corrector for correcting a bandgap circuit may be further implemented with the offset-cancelling circuit individually.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

It will be apparent to those skilled in the art that various modifications and variations can be made in the invention. It is intended that the standard and examples be considered as exemplary only, with a true scope of the disclosed embodiments being indicated by the following claims and their equivalents.

What is claimed is:

1. A low-offset bandgap circuit to provide a reference voltage at an output node, comprising:
   a core bandgap circuit, comprising a core operational amplifier to generate a core current; and
   an offset-cancelling circuit, coupled to two input terminals of the core operational amplifier, and generating a compensation current according to voltages at the two input terminals of the core operational amplifier to compensate for an offset voltage of the core operational amplifier, wherein the reference voltage is generated according to the core current and the compensation current;
   wherein the offset-cancelling circuit comprises two operational amplifiers, and an offset voltage of each of the operational amplifiers is substantially equal to the offset voltage of the core operational amplifier.

2. The low-offset bandgap circuit as claimed in claim 1, wherein each of the operational amplifiers has at least one input terminal coupled to a respective one of the input terminals of the core operational amplifier.

3. The low-offset bandgap circuit as claimed in claim 1, wherein the core operational amplifier has a first input terminal coupled to a first node, a second input terminal coupled to a second node, and an output terminal, wherein the compensation current is generated according to a first current and a second current, and wherein the first current is generated according to a voltage at the first node and the second current is generated according to a voltage at the second node.

4. The low-offset bandgap circuit as claimed in claim 3, wherein the offset-cancelling circuit comprises:
   a first operational amplifier, having a first input terminal coupled to the first node, a second input terminal, and an output terminal;
   a first P-type transistor, having a gate coupled to the output terminal of the first operational amplifier, a source coupled to a work voltage, and a drain generating the first current;
   a second P-type transistor, having a gate coupled to the output terminal of the first operational amplifier, a source coupled to the work voltage, and a drain coupled to the second input terminal of the first operational amplifier; and
   a first resistor, coupled between the second input terminal of the first operational amplifier and the ground voltage.

5. The low-offset bandgap circuit as claimed in claim 3, wherein the offset-cancelling circuit comprises:
   a second operational amplifier, having a first input terminal coupled to the second node, a second input terminal, and an output terminal;
   a third P-type transistor, having a gate coupled to the output terminal of the second operational amplifier, a source coupled to a work voltage, and a drain generating the second current;
   a fourth P-type transistor, having a gate coupled to the output terminal of the second operational amplifier, a source coupled to the work voltage, and a drain coupled to the second input terminal of the second operational amplifier; and
   a second resistor, coupled between the second input terminal of the second operational amplifier and the ground voltage.

6. The low-offset bandgap circuit as claimed in claim 3, wherein the compensation current is generated by subtracting second current from the first current.

7. The low-offset bandgap circuit as claimed in claim 3, wherein the core bandgap circuit further comprises:
   a first BJT (Bipolar Junction Transistor), wherein the first BJT has a base coupled to the ground voltage, an emitter coupled to the first node, and a collector coupled to the ground voltage;
   a second BJT, wherein the second BJT has a base coupled to the ground voltage, an emitter, and a collector coupled to the ground voltage;
   a third BJT, wherein the third BJT has a base coupled to the ground voltage, an emitter, and a collector coupled to the ground voltage;
   a third resistor, coupled between the second node and the emitter of the second BJT; and
   a fourth resistor, coupled between the output node and the emitter of the third BJT,
   wherein the core current is generated according to a resistance of the third resistor and emitter areas of the first BJT and the second BJT.

8. The low-offset bandgap circuit as claimed in claim 7, wherein the reference voltage is generated according to resistances of the third resistor and the fourth resistor and emitter areas of the first BJT, the second BJT, and the third BJT.

9. The low-offset bandgap circuit as claimed in claim 7, wherein the emitter area ratio of the first BJT to the second BJT to the third BJT is substantially 1:8:1.

10. The low-offset bandgap circuit as claimed in claim 7, wherein the resistance of the third resistor is substantially equal to 100 kΩ, and a resistance of the fourth resistor is substantially equal to 1000 kΩ.

11. A corrector for correcting an output voltage of a bandgap circuit comprising a core operational amplifier with an offset voltage, the bandgap circuit providing a reference voltage at an output node, the core operational amplifier generating a core current, and the corrector comprising:
an offset-cancelling circuit, generating a compensation current according to voltages at two input terminals of the core operational amplifier to compensate for the offset voltage of the core operational amplifier, wherein the reference voltage is generated according to the core current and the compensation current;
wherein the offset-cancelling circuit comprises two operational amplifiers, and an offset voltage of each of the operational amplifiers is substantially equal to the offset voltage of the core operational amplifier.

12. The corrector as claimed in claim 11, wherein each of the operational amplifiers has at least one input terminal coupled to a respective one of the input terminals of the core operational amplifier.

13. The corrector as claimed in claim 11, wherein the core operational amplifier has a first input terminal coupled to a first node, a second input terminal coupled to a second node, and an output terminal, wherein the compensation current is generated according to a first current and a second current, and wherein the first current is generated according to a voltage at the first node and the second current is generated according to a voltage at the second node.

14. The corrector as claimed in claim 13, wherein the offset-cancelling circuit comprises:
a first operational amplifier, having a first input terminal coupled to the first node, a second input terminal, and an output terminal;
a first P-type transistor, having a gate coupled to the output terminal of the first operational amplifier, a source coupled to a work voltage, and a drain generating the first current;
a second P-type transistor, having a gate coupled to the output terminal of the first operational amplifier, a source coupled to the work voltage, and a drain coupled to the second input terminal of the first operational amplifier; and
a first resistor, coupled between the second input terminal of the first operational amplifier and the ground voltage.

15. The corrector as claimed in claim 13, wherein the offset-cancelling circuit comprises:
a second operational amplifier, having a first input terminal coupled to the second node, a second input terminal, and an output terminal;
a third P-type transistor, having a gate coupled to the output terminal of the second operational amplifier, a source coupled to a work voltage, and a drain generating the second current;
a fourth P-type transistor, having a gate coupled to the output terminal of the second operational amplifier, a source coupled to the work voltage, and a drain coupled to the second input terminal of the second operational amplifier; and
a second resistor, coupled between the second input terminal of the second operational amplifier and the ground voltage.

16. The corrector as claimed in claim 13, wherein the compensation current is generated by subtracting the second current from the first current.

* * * * *